(12) United States Patent
Tsuruoka et al.

(10) Patent No.: US 9,837,560 B2
(45) Date of Patent: Dec. 5, 2017

(54) SOLAR BATTERY CELL, SOLAR BATTERY MODULE, METHOD OF MAKING SOLAR BATTERY CELL AND METHOD OF MAKING SOLAR BATTERY MODULE

(75) Inventors: Yasuo Tsuruoka, Chikusei (JP); Kenzou Takemura, Chikusei (JP); Naoki Fukushima, Chikusei (JP); Yusuke Asakawa, Chikusei (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 660 days.

(21) Appl. No.: 13/414,775

(22) Filed: Mar. 8, 2012

(65) Prior Publication Data

US 2012/0227784 A1    Sep. 13, 2012

Related U.S. Application Data

(60) Provisional application No. 61/450,297, filed on Mar. 8, 2011.

(30) Foreign Application Priority Data

Mar. 8, 2011 (JP) ................................. 2011-050724

(51) Int. Cl.
  *H01L 31/0224*  (2006.01)
  *H01L 31/05*  (2014.01)
(52) U.S. Cl.
  CPC ............ *H01L 31/022425* (2013.01); *H01L 31/022433* (2013.01); *H01L 31/0504* (2013.01);
  (Continued)

(58) Field of Classification Search
  CPC ............................................. H01L 31/022433
  See application file for complete search history.

(56) References Cited

U.S. PATENT DOCUMENTS

2007/0128827 A1    6/2007  Faris
2008/0121265 A1*   5/2008  Hishida ........... H01L 31/022425
                                                      136/244
(Continued)

FOREIGN PATENT DOCUMENTS

CN    1606175 A    4/2005
CN    1917236 A    2/2007
(Continued)

OTHER PUBLICATIONS

Machine translation of JP2008-135655.*
(Continued)

*Primary Examiner* — Eric R Smith
(74) *Attorney, Agent, or Firm* — Fitch, Even, Tabin & Flannery, LLP

(57) ABSTRACT

A solar battery cell and related methodology are provided which enable a TAB wire to be accurately connected to an intended position, thus allowing a possible increase in manufacturing costs to be suppressed. A solar battery cell includes a plurality of finger electrodes arranged on a light receiving surface of a photovoltaic substrate, the light receiving surface having a region of predetermined width to receive a conductive adhesive of a same width as the region. The region is provided with an alignment marking indicating a position where the adhesive is to be applied over the surface, the alignment marking having a cross-dimension in a widthwise direction of the region that is less than the predetermined width.

45 Claims, 9 Drawing Sheets

(52) U.S. Cl.
CPC ......... *Y02E 10/50* (2013.01); *Y10T 29/49002* (2015.01); *Y10T 156/10* (2015.01)

(56) References Cited

U.S. PATENT DOCUMENTS

| | | | |
|---|---|---|---|
| 2010/0000602 A1* | 1/2010 | Gray et al. | 136/256 |
| 2010/0263705 A1 | 10/2010 | Ide et al. | |
| 2011/0011454 A1* | 1/2011 | Taira | 136/256 |
| 2011/0014725 A1 | 1/2011 | Abiko | |
| 2011/0088746 A1 | 4/2011 | Hong et al. | |
| 2012/0031457 A1* | 2/2012 | Taira | H01L 31/0508 136/244 |
| 2012/0125396 A1* | 5/2012 | Taira et al. | 136/244 |

FOREIGN PATENT DOCUMENTS

| | | | |
|---|---|---|---|
| CN | 101395722 A | 3/2009 | |
| CN | 101779298 A | 7/2010 | |
| CN | 101826569 A | 9/2010 | |
| CN | 101939873 A | 1/2011 | |
| CN | 101976692 A | 2/2011 | |
| CN | 202651127 U | 1/2013 | |
| JP | 8-8452 A | 1/1996 | |
| JP | 08-330615 A | 12/1996 | |
| JP | 2000-261012 A | 9/2000 | |
| JP | 2001-068699 A | 3/2001 | |
| JP | 2002-263880 A | 9/2002 | |
| JP | 2003-133570 A | 5/2003 | |
| JP | 2004-204256 A | 7/2004 | |
| JP | 2005-243935 A | 9/2005 | |
| JP | 2007-103473 A | 4/2007 | |
| JP | 2007-265635 A | 10/2007 | |
| JP | 2008-85225 A | 4/2008 | |
| JP | 2008-135652 A | 6/2008 | |
| JP | 2008-135655 A | 6/2008 | |
| JP | 2009-295860 A | 12/2009 | |
| JP | 2009-295940 A | 12/2009 | |
| JP | 2010-027778 A | 2/2010 | |
| JP | WO 2010095583 A1 * | 8/2010 | ......... H01L 31/0508 |
| JP | 2010-258167 A | 11/2010 | |
| JP | 2011-171722 A | 9/2011 | |
| JP | 2012-019078 A | 1/2012 | |
| WO | WO 2007/001004 A1 | 1/2007 | |
| WO | 2009/017174 A1 | 2/2009 | |
| WO | WO 2009/099179 A1 | 8/2009 | |
| WO | 2009/122977 A1 | 10/2009 | |
| WO | 2010/125679 A1 | 11/2010 | |
| WO | 2011/021655 A1 | 2/2011 | |
| WO | WO 2011013814 A2 * | 2/2011 | |
| WO | 2012/121348 A1 | 9/2012 | |

OTHER PUBLICATIONS

Machine translation of JP2010-027778.*
U.S. Appl. No. 13/414,807, filed Mar. 8, 2012.
U.S. Appl. No. 13/483,603, filed May 30, 2012.
International Search Report dated Apr. 17, 2012 in International Application No. PCT/JP2012/056012.
International Search Report dated Apr. 17, 2012 in International Application No. PCT/JP2012/056013.
English translation of International Preliminary Report on Patentability from International Patent Application No. PCT/JP2012/063895, dated Dec. 27, 2013.
English translation of International Preliminary Report on Patentability from International Patent Application No. PCT/JP2012/056012, dated Sep. 19, 2013.
English translation of International Preliminary Report on Patentability from International Patent Application No. PCT/JP2012/056013, dated Sep. 19, 2013.
Office Action of U.S. Appl. No. 13/483,603 dated Apr. 7, 2015.
Office Action in counterpart CN Appln. No. 201210177989.4 dated Feb. 22, 2016.
Office Action of CN Appln. No. 201210060091.9 (not counterpart application) dated Jul. 27, 2015.
Office Action of JP Appln. No. 2012-278212 dated Feb. 16, 2016.
Office Action JP Appln. 2013-503614 dated Jan. 19, 2016.
Office Action in counterpart JP appln. 2013-503613 dated Jan. 26, 2016.
Office Action of U.S. Appl. No. 13/483,603 dated Nov. 5, 2015 not counterpart.
Office Action of CN Appln. No. 201210060091.9 dated May 16, 2016.
Office Action of counterpart My Patent Application No. PI2013701389 dated Jul. 14, 2017 in English.
Office Action of counterpart JP Patent Application No. P2016-203587 dated Oct. 3, 2017.

* cited by examiner

SOLAR BATTERY CELL, SOLAR BATTERY MODULE, METHOD OF MAKING SOLAR BATTERY CELL AND METHOD OF MAKING SOLAR BATTERY MODULE

BACKGROUND OF THE INVENTION

Field of the Invention

The present invention relates to a solar battery cell, a solar battery module, a method of making a solar battery cell and a method of making a solar battery module.

Related Background Art

In recent years, much attention has been paid to solar batteries as means for solving increasingly serious global warming and fossil energy depletion problems. A solar battery is normally formed by connecting a plurality of solar battery cells together in series or parallel. The solar battery cell includes a plurality of linear electrodes (finger electrodes) arranged in parallel on a front surface (light receiving surface) thereof and formed of Ag in order to provide power. A back surface electrode formed of Al is formed all over a back surface of the solar battery cell. Then, adjacent solar battery cells are connected together by connecting a metal wiring member (TAB wire) to the light receiving surface of one of the adjacent solar battery cells so that the metal wiring member crosses the all the finger electrodes and further connecting the TAB wire to the back surface electrode of the other solar battery cell.

Solder exhibiting proper conductivity is conventionally used to connect the TAB wire (Japanese Patent Laid-Open No. 2002-263880). Furthermore, in some cases, Sn—Ag—Cu solder, which contains no Pb, has recently been used with environmental problems taken into account (Japanese Patent Laid-Open Nos. 2002-263880 and 2004-204256). However, when these solders are used to connect the TAB wire, the solar battery cells are heated at about 220° C. or higher. Thus, the yield of the connection step may decrease or the solar battery cells may be warped. To suppress this, silicon in the solar battery cells may be increased in thickness. However, in this case, manufacturing costs increase.

Furthermore, when such solder as described is used to connect the TAB wire, the following measure needs to be taken in order to ensure wettability of the solder: electrodes (bus bar electrodes) formed of Ag is preformed on the front and back surfaces of the solar battery cell at the positions where the TAB wires are located. However, Ag is expensive, thus contributing to increasing costs. Additionally, Ag offers high electric resistance, and thin bus bar electrodes thus offer high sheet resistance. This increases power loss, thereby reducing the power generation performance of the solar battery cells. Thus, to suppress the sheet resistance of the bus bar electrodes, the bus bar electrodes need to be increased in width to some degree. This further increases the manufacturing costs.

Hence, in recent years, a method has been proposed in which a conductive adhesive with a conductive adhesion layer is used instead of the solder to connect the TAB wire (Japanese Patent Laid-Open Nos. 8-330615, 2003-133570, 2005-243935, and 2007-265635). The conductive adhesive is a thermosetting resin in which metal particles such as Al particles are mixed and dispersed. The metal particles are sandwiched between the TAB wire and the electrode of the solar battery cell to achieve electric connection. If the conductive adhesive is used to connect the TAB wire, the connection can be carried out at 200° C. or lower. This suppresses a decrease in the yield of the connection step and the warpage of the solar battery cells. Furthermore, if the conductive adhesive is used to connect the TAB wire, the wettability need not be ensured. This in turn eliminates the need for the bus bar electrodes, formed to ensure the wettability, thus reducing the use of Ag.

However, avoidance of formation of bus bar electrodes on the front or back surface of the solar battery cell prevents identification of the position where the TAB wires are connected. This may preclude the TAB wires from being accurately stuck to intended positions. When the TAB wires fail to be stuck to the intended positions, the lines of the solar battery cells may meander. Then, a residual stress may be generated in the solar battery cells, and the manufacturing yield may decrease.

The present invention has been made to solve the above-described problems. An object of the present invention is to provide a solar battery cell that enables the TAB wire to be accurately connected to the intended position, while allowing a possible increase in manufacturing costs to be suppressed.

SUMMARY OF THE INVENTION

According to one of its broad concepts, the invention povides a solar battery cell, including a plurality of finger electrodes arranged on a light receiving surface of a photovoltaic substrate, the light receiving surface having a region of predetermined width to receive a conductive adhesive of a same width as said region, wherein the region is provided with an alignment marking indicating a position where the adhesive is to be applied over the surface, in the inside of said region, in the outside of said region, or in a position which lies in both inside and outside of said region, the alignment marking having a cross-dimension in a widthwise direction of said region that is less than the predetermined width.

In one of its aspects, the present invention provides a solar battery cell including a plurality of finger electrodes arranged on a light receiving surface and a TAB wire connected to the finger electrodes via a conductive adhesive, the solar battery cell including an alignment marking (also referred to throughout the specification as an alignment mark or marks) provided on the light receiving surface and indicating a position where the TAB wire is connected to the finger electrodes, the alignment mark crossing all the finger electrodes so as to connect together the finger electrodes positioned at opposite ends of the light receiving surface, the alignment mark being formed integrally with the finger electrodes using a material identical to that of the finger electrodes, the alignment mark having a line width equal to or smaller than a line width of each of the finger electrodes.

In the solar battery cell according to the present invention, the alignment mark indicative of the position where the TAB wire is connected to the finger electrodes is provided on the light receiving surface to cross all the finger electrodes so as to connect together the finger electrodes positioned at the opposite ends of the light receiving surface. Thus, the position where the TAB wire is connected can be visually identified. This allows the TAB wire to be accurately connected to an intended position. Furthermore, the alignment mark is formed integrally with the finger electrodes using the material identical to that of the finger electrodes. Thus, the alignment mark can be easily formed simultaneously with formation of the finger electrodes. Additionally, the alignment mark is formed so as to have a line width equal to or smaller than that of each of the finger electrodes. This serves to suppress a possible increase in the usage of the electrode material. Hence, a possible increase in manufacturing costs can be restrained.

According to another aspect, the present invention provides a solar battery cell including a plurality of finger electrodes arranged on a light receiving surface and a TAB wire connected to the finger electrodes via a conductive adhesive, the solar battery cell including an alignment mark provided on the light receiving surface and indicating a position where the TAB wire is connected to the finger electrodes, the alignment mark crossing all the finger electrodes so as to connect together the finger electrodes positioned at opposite ends of the light receiving surface, the alignment mark being formed integrally with the finger electrodes using a material identical to that of the finger electrodes, the alignment mark having a line width of at least 0.05 mm and at most 0.2 mm.

In the solar battery cell according to the present invention, the alignment mark indicative of the position where the TAB wire is connected to the finger electrodes is provided on the light receiving surface to cross all the finger electrodes so as to connect together the finger electrodes positioned at the opposite ends, of the light receiving surface. Thus, the position where the TAB wire is connected can be visually identified. This allows the TAB wire to be accurately connected to an intended position. Furthermore, the alignment mark is formed integrally with the finger electrodes using the material identical to that of the finger electrodes. Thus, the alignment mark can be easily formed simultaneously with formation of the finger electrodes. Additionally, the alignment mark is formed so as to have a line width of at least 0.05 mm and at most 0.2 mm. This serves to suppress a possible increase in the usage of the electrode material. Hence, a possible increase in manufacturing costs can be restrained.

Here, the alignment mark preferably extends to outside of the finger electrodes positioned at the opposite ends. Then, when the conductive adhesive is applied to the solar battery cell, the alignment mark can be stuck out from the conductive adhesive. This allows visual determination whether or not the conductive adhesive has been applied to the intended position. Hence, the TAB wire can be more accurately connected to the intended position.

Furthermore, the present invention provides a solar battery module including a plurality of the above-described solar battery cells arranged therein so that finger electrodes on one of adjacent solar battery cells are connected to a back surface electrode formed on a back surface of another of the adjacent solar battery cells, by means of the TAB wire arranged along the alignment mark via a conductive adhesive. In the solar battery module according to the present invention, the TAB wire is accurately connected to an intended position, allowing an array of solar battery cells to be restrained from meandering. Thus, when a solar battery module is manufactured, a possible residual stress in the solar battery cells can be suppressed. Therefore, manufacturing yield can be improved.

Thus, in a solar battery module of the invention, the TAB wire is positioned along the alignment marking on one of the plurality of solar battery cells and is connected to the finger electrodes of the one solar battery cell via the conductive adhesive, and the TAB wire is further connected to a back surface electrode formed on a back surface of the another of the plurality of solar battery cells.

According to another broad concept, the invention provides a method of making a solar battery cell, comprising: providing a photovoltaic substrate having a plurality of finger electrodes arranged on a light receiving surface thereof, the light receiving surface having a region of predetermined width to receive a conductive adhesive of a same width as said region; and providing said region with an alignment marking indicating a position where the adhesive is to be applied over the surface, in the inside of said region, in the outside of said region, or in a position which lies in both inside and outside of said region, the alignment marking having a cross-dimension in a widthwise direction of said region that is less than the predetermined width, the alignment marking being provided either before or after the plurality of finger electrodes are formed on the light receiving surface.

The present invention can provide a solar battery cell and related methodology that enable the TAB wire to be accurately connected to intended position, while allowing a possible increase in manufacturing costs to be suppressed.

DESCRIPTION OF THE PREFERRED EMBODIMENTS

Figure 1:
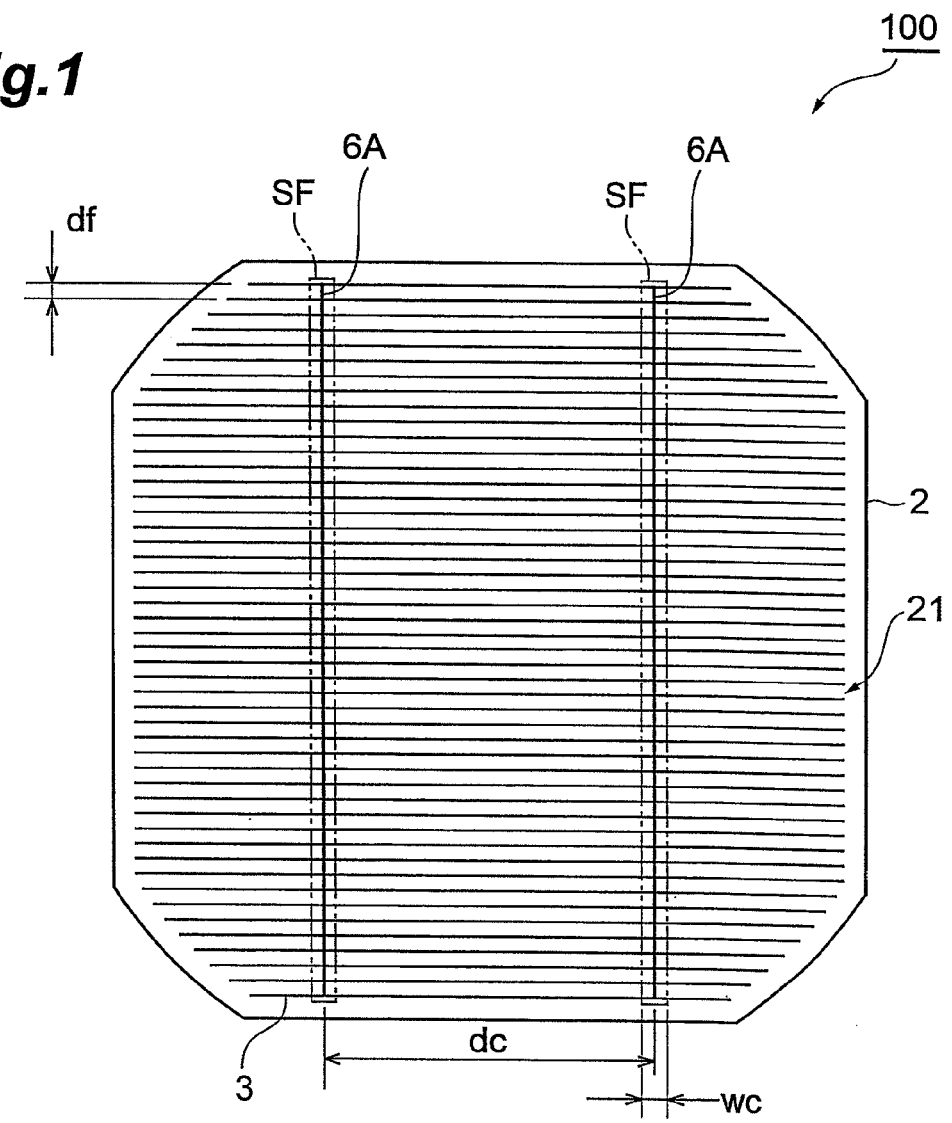
FIG. 1 is a plan view showing a light receiving surface of a solar battery cell according to a first embodiment of the present invention.

Preferred embodiments of a solar battery cell and a method for manufacturing the solar battery cell according to the present invention will be described below in detail with reference to the drawings. The same elements are denoted by the same reference numerals, and duplicate descriptions are omitted.

Figure 2:
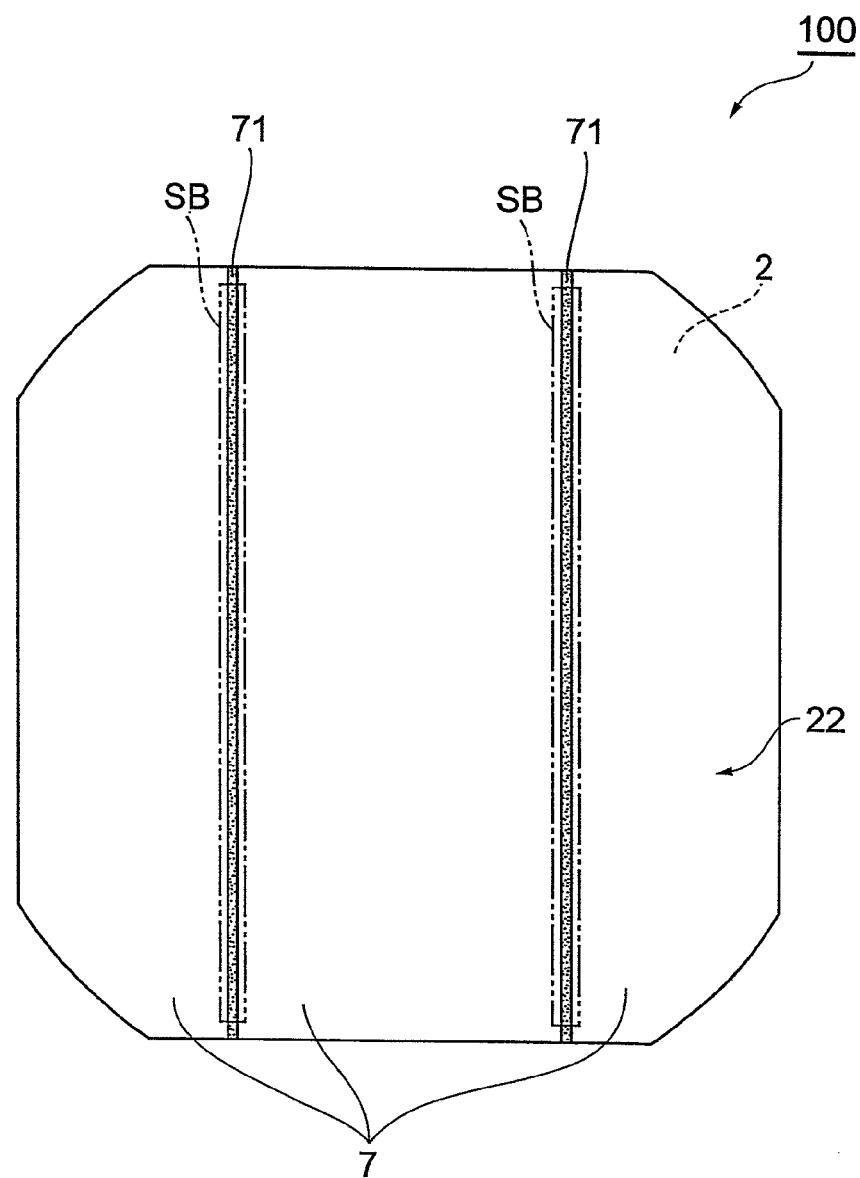
FIG. 2 is a bottom view showing a back surface of the solar battery cell in FIG. 1.
Figure 3:
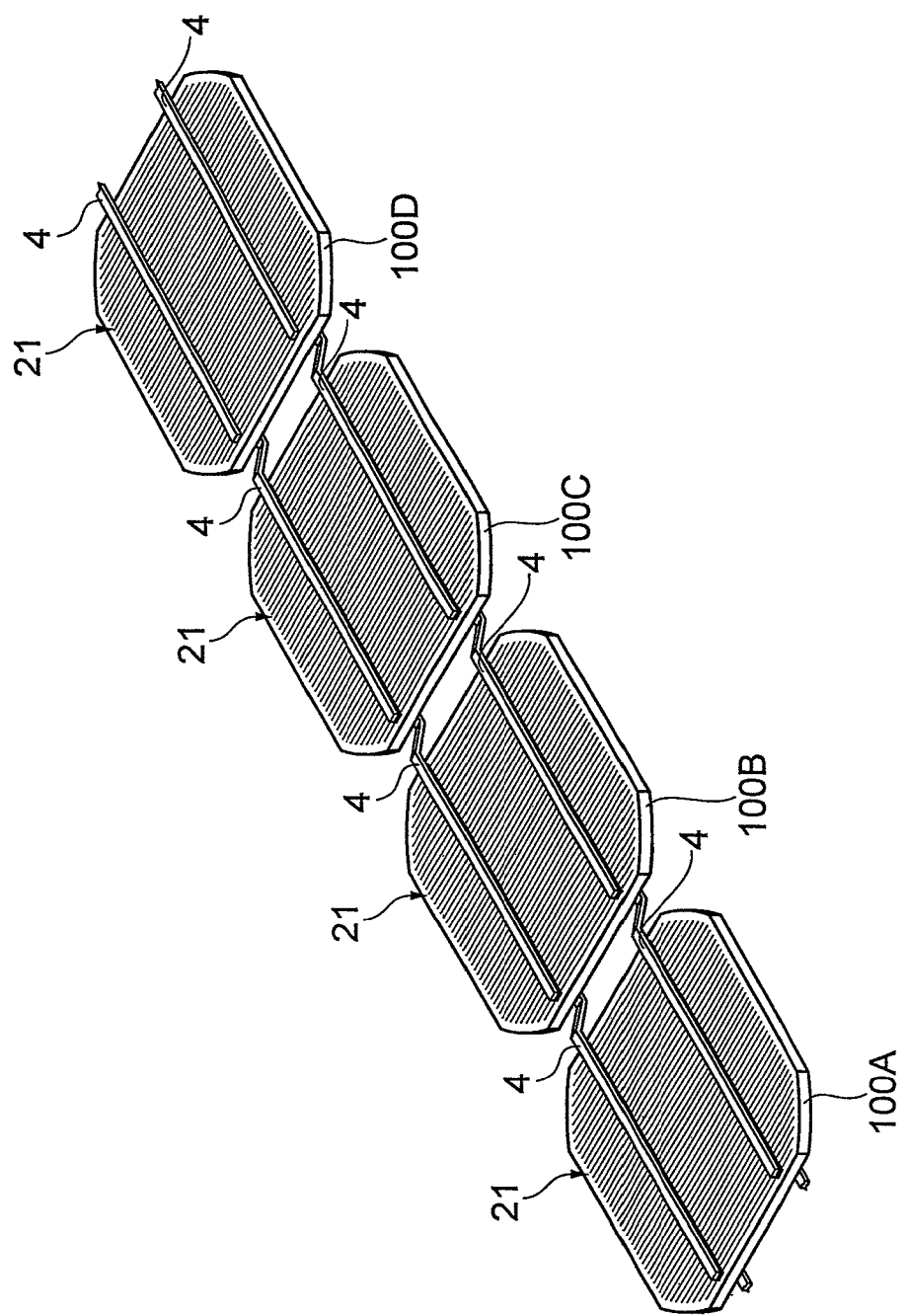
FIG. 3 is a perspective view showing that a plurality of the solar battery cells in FIG. 1 are connected together.
Figure 4:
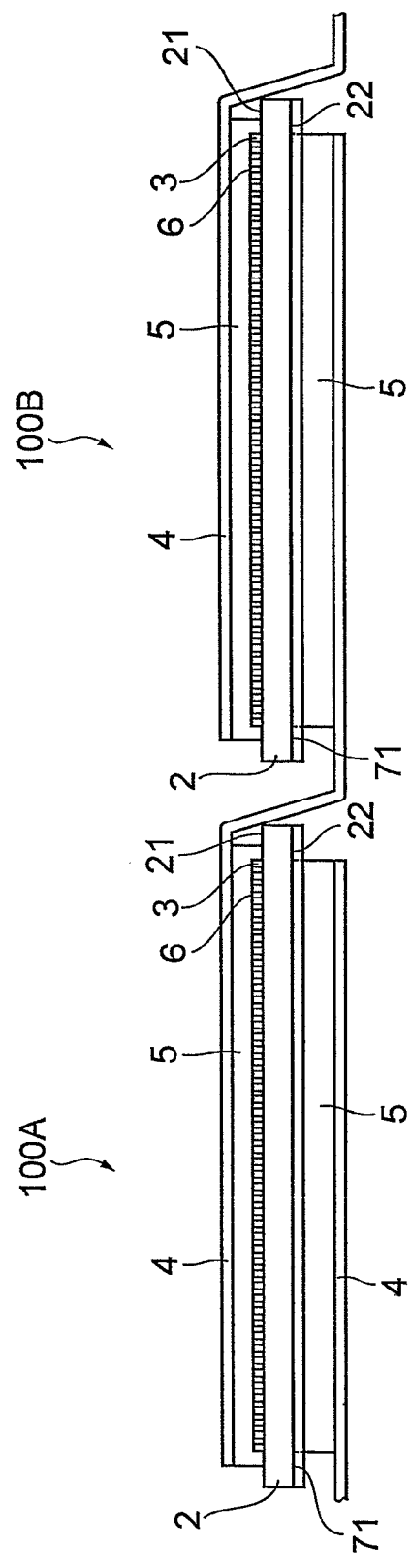
FIG. 4 is a schematic side view of FIG. 3.

FIG. 1 is a plan view showing a light receiving surface of a solar battery cell according to a first embodiment of the present invention. FIG. 2 is a bottom view showing a back surface of the solar battery cell in FIG. 1. FIG. 3 is a perspective view showing that a plurality of the solar battery cells in FIG. 1 are connected together. FIG. 4 is a schematic side view of FIG. 3.

As shown in FIG. 1, a solar battery cell 100 is such that a plurality of the solar battery cells 100 are electrically connected together in series or parallel to form one solar battery module. The solar battery cell 100 includes a substrate 2. The substrate 2 is generally square and has four circular-arc corners. One surface of the substrate 2 corresponds to a light receiving surface 21. The other surface of the substrate 2 corresponds to a back surface 22 (see FIG. 2). The substrate 2 may be formed of at least one of a single crystal of Si, a polycrystal of Si, and a non-crystal of Si. On the light receiving surface 21 side, the substrate 2 may be formed of an n- or p-type semiconductor. On the substrate 2, for example, the distance between two opposite sides is 125 mm.

A plurality of (for example, 48) linear finger electrodes 3 are arranged on the light receiving surface 21 parallel to and away from one another. When a plurality of the solar battery cells 100 are connected together to form a solar battery module, TAB wires 4 are connected to the finger electrodes 3 via respective conductive adhesion films (conductive adhesives) 5 (see FIG. 4). Each of the finger electrodes 3 is, for example, 0.15 mm in line width. The distance df between the adjacent finger electrodes 3 is, for example, 2.55 mm.

Each of the finger electrodes 3 is formed of a known material providing electric continuity. Examples of the material of the finger electrode 3 include a glass paste containing silver; a silver paste, a gold paste, a carbon paste, a nickel paste, and an aluminum paste each containing an adhesive resin with one of the various types of conductive particles dispersed therein; and ITO formed by burning or deposition. Among these materials, the glass paste containing silver is preferably used in terms of heat resistance, electric conductivity, stability, and costs.

Adhesion areas SF, SF are areas of the light receiving surface 21 to which the respective conductive adhesion films 5, 5 are applied. The width we of the adhesion areas SF (that is, the width at the conductive adhesion films 5) is, for example, 1.2 mm. The distance dc between the adhesion areas SF, SF is, for example, 62 mm. Furthermore, the TAB wire 4, connected to the adhesion area SF, is, for example, 1.5 mm in width.

Linear light receiving surface alignment marks 6A, 6A are provided on the light receiving surface 21 to cross all the finger electrodes 3 so as to connect together the finger electrodes 3, 3 positioned at the opposite ends of the light receiving surface 21. The light receiving surface alignment mark 6A is indicative of the position where the corresponding TAB wire 4 is connected to the finger electrodes 3. For example, the light receiving surface alignment mark 6A is located, for example, in a central portion of the adhesion area SF.

The light receiving surface alignment mark 6A is formed integrally with the finger electrodes 3 using the same material as that of the finger electrodes 3. That is, the light receiving surface alignment mark 6A is formed of a glass paste containing silver; a silver paste, a gold paste, a carbon paste, a nickel paste, or an aluminum paste containing an adhesive resin with one of the various types of conductive particles dispersed therein; or ITO formed by burning or deposition. Among these materials, the glass paste containing silver is preferably used in terms of heat resistance, electric conductivity, stability, and costs. The light receiving surface alignment marks 6A are formed simultaneously with formation of the finger electrodes 3.

The light receiving surface alignment mark 6A is at least 0.05 mm and at most 0.2 mm, for example, in the present embodiment, 0.15 mm in width similarly to the finger electrode 3. That is, the light receiving surface alignment mark 6A has a line width equal to or smaller than that of the finger electrode 3. The light receiving surface alignment mark 6A with a line width of at least 0.05 mm ensures visibility and functions as an alignment mark. Furthermore, the light receiving surface alignment mark 6A with a line width of at most 0.2 mm enables a reduction in the usage of the electrode material. Moreover, the light receiving surface alignment mark 6A with a line width equal to or smaller than that of the finger electrode 3 enables a further reduction in the usage of the electrode material. Alternatively, each portion 61A of the light receiving surface alignment mark 6A is preferably at most 20% of the line width of the connected TAB wire in line width. Additionally, the distance between the light receiving surface alignment marks 6A, 6A is, for example, 62 mm like the distance dc between the adhesion areas SF, SF.

As shown in FIG. 2, a back surface electrode 7 is formed all over a back surface 22 of the solar battery cell 100. When a plurality of solar battery cells 100 are connected together to form a solar battery module, the TAB wires 4 are connected to the back surface electrode 7 via the respective conductive adhesion films 5 (see FIG. 4). The back surface electrode 7 is formed by, for example, burning an aluminum paste.

Adhesion areas SB, SB indicate areas of the back surface 22 to which the conductive adhesion films 5 are applied. The positions of the adhesion areas SB, SB correspond to those of the adhesion areas SF on the light receiving surface 21. The width of the adhesion area SB is, for example, 1.2 mm like the width we of the adhesion area SF (see FIG. 1). The distance between the adhesion areas SB, SB is, for example, about 62 mm like the distance dc between the adhesion areas SF, SF (see FIG. 1). Furthermore, the width of the TAB wire 4 connected to the corresponding adhesion area SB is, for example, 1.5 mm like the width of the TAB wire connected to the light receiving surface 21.

Back surface alignment marks 71, 71 are provided on the back surface 22 along the respective adhesion areas SB so as to connect two opposite sides on the substrate 2. The back surface alignment mark 71 is indicative of the position where the corresponding TAB wire 4 is connected to the back surface electrode 7. For example the back surface alignment mark 71 is located, for example, in a central portion of the adhesion area SB. The back surface alignment mark 71 is shaped like a groove. A part of the substrate 2 located under the back surface electrode 7 which part corresponds to the back surface alignment mark 71 is exposed from the back surface electrode 7 and is thus visible.

When the TAB wires 4 are connected to the back surface electrode 7 via the respective conductive adhesion films 5, the conductive adhesion films 5 need to be reliably in contact with the back surface electrode 7. Thus, the width of the back surface alignment mark 71 is smaller than that of the TAB wire 4 and is, for example, about 0.1 to 0.9 mm. The distance between the back surface alignment marks 71, 71 is, for example, 62 mm like the distance between the adhesion areas SB, SB.

As shown in FIG. 3, such solar battery cells 100 are arranged in a row so that the light receiving surface alignment marks 6A form a straight line, and coupled together by means of the TAB wires 4 which are arranged along the respective light receiving surface alignment marks 6A via the conductive adhesion films 5. The coupling is achieved by connecting the finger electrodes 3 on the light receiving surface 21 side of a solar battery cell 100A to the back surface electrode 7 on the back surface 22 side of a solar battery cell 100B adjacent to the solar battery cell 100A, by means of the corresponding TAB wires 4 (see FIG. 4), further connecting the finger electrodes 3 on the light receiving surface 21 side of the solar battery cell 100B to the back surface electrode 7 on the back surface 22 side of a solar battery cell 100C adjacent to the solar battery cell 100B, by means of the corresponding TAB wires, and repeating such operations. Thus, the plurality of solar battery cells 100 arranged in a line are electrically connected together in series. One or more such arrays are provided to form a solar battery module.

As described above, in the solar battery cell 100 according to the present embodiment, the light receiving surface alignment marks 6A, 6A, each indicative of the position where the corresponding TAB wire 4 is connected to the finger electrodes 3, are formed on the light receiving surface 21 to cross all the finger electrodes 3 so as to connect together the finger electrodes 3, 3 positioned at the opposite ends of the light receiving surface 21. Hence, the connection positions of the TAB wires 4 can be seen so that the TAB wires 4 can be accurately connected to the intended positions.

Furthermore, in the solar battery cell 100, each of the light receiving surface alignment marks 6A is formed integrally with the finger electrodes 3 using the same material as that of the finger electrodes 3. The light receiving surface alignment marks 6A are formed simultaneously with formation of the finger electrodes 3. Thus, the light receiving surface alignment marks 6A can be easily formed. Furthermore, the light receiving surface alignment mark 6A is formed to have a line width of at least 0.05 mm and at most 0.2 mm and a line width equal to or smaller than that of the finger electrode 3. Consequently, a possible increase in the usage of the electrode material can be suppressed. Since the light receiving surface alignment marks 6A can be easily formed with a possible increase in the usage of the electrode material suppressed as described above, a possible increase in manufacturing costs can be restrained.

Furthermore, in the solar battery module formed of the solar battery cells 100, a plurality of the solar battery cells 100 are arranged, and the finger electrodes 3 on one of the adjacent solar battery cells 100 are connected to the back surface electrode 7 formed on the back surface 22 of the other solar battery cell 100 by means of the respective TAB wires 4 arranged along the corresponding light receiving surface alignment marks 6A via the corresponding conductive adhesion films 5. In such a solar battery module, the TAB wires 4 are accurately connected to the intended positions, allowing the array of the solar battery cells 100 to be restrained from meandering. Thus, when a solar battery module is manufactured, a possible residual stress in the solar battery cells 100 can be suppressed, allowing manufacturing yield to be improved.

Now, a solar battery cell according to a second embodiment of the present invention will be described. The description of the present embodiment focuses on differences from the first embodiment.

Figure 5:
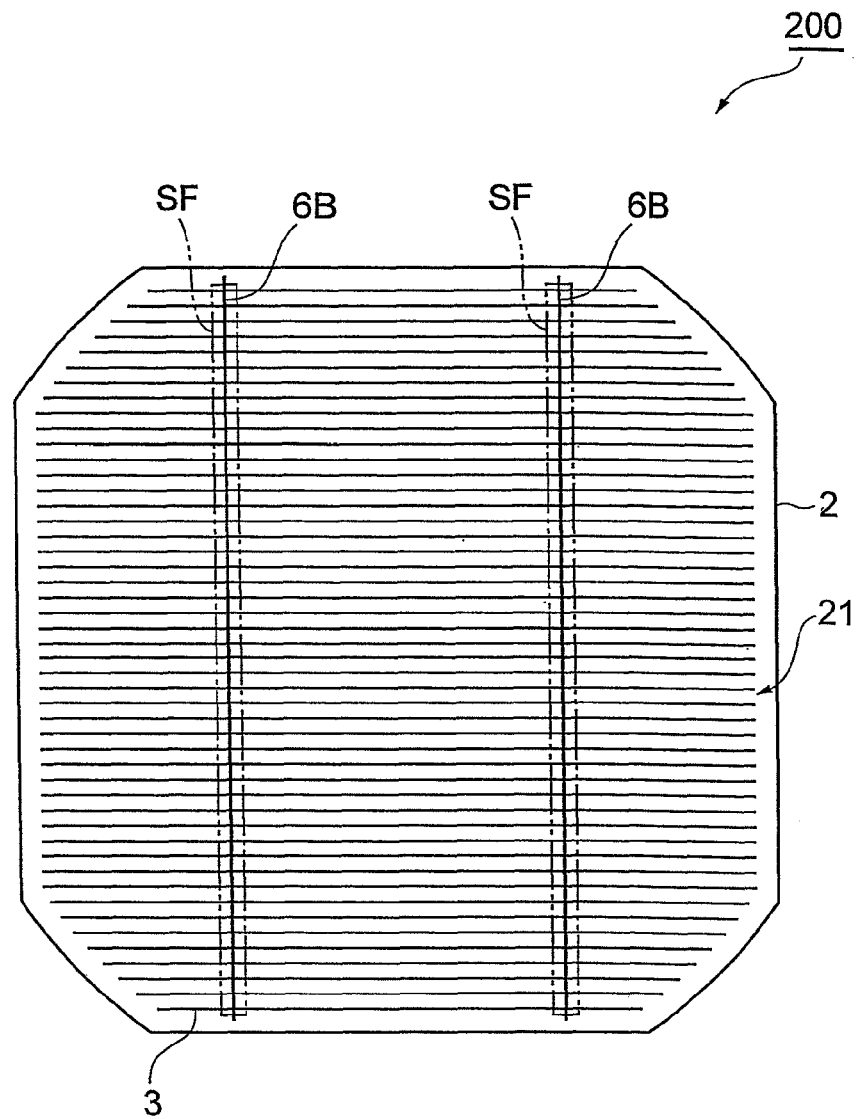
FIG. 5 is a plan view showing a front surface of a solar battery cell according to a second embodiment of the present invention.

FIG. 5 is a plan view showing a front surface of the solar battery cell according to the second embodiment of the present invention. As shown in FIG. 5, a solar battery cell 200 according to the present embodiment is different from the solar battery cell 100 according to the first embodiment (see FIG. 1) in that the solar battery cell 200 includes light receiving surface alignment marks 6B, 6B instead of the light receiving surface alignment marks 6A, 6A.

The light receiving surface alignment mark 6B is linear and is provided to cross all the finger electrodes 3 so as to connect the finger electrodes 3 positioned at the opposite ends of the light receiving surface. Moreover, the light receiving surface alignment mark 6B extends to the outside of the finger electrodes 3, 3 positioned at the opposite ends of the light receiving surface. Thus, the opposite ends of the light receiving surface alignment mark 6B stick out from the corresponding adhesion area SF.

In the solar battery cell 200 as described above, each of the light receiving surface alignment marks 6B, 6B is indicative of the position where the corresponding TAB wire 4 is connected to the finger electrodes 3. The light receiving surface alignment mark 6B is formed on the light receiving surface 21 to cross all the finger electrodes 3 so as to connect together the finger electrodes 3, 3 positioned at the opposite ends of the light receiving surface. Hence, the position where the TAB wire 4 is connected to the finger electrodes 3 can be visually identified. The TAB wires 4 can be accurately connected to the intended positions.

Furthermore, in the solar battery cell 200, each of the light receiving surface alignment marks 6B is formed integrally with the finger electrodes 3 using the same material as that of the finger electrodes 3. Moreover, the light receiving surface alignment marks 6A are formed simultaneously with formation of the finger electrodes 3. Thus, the light receiving surface alignment marks 6B can be easily formed. Furthermore, the light receiving surface alignment mark 6B is formed to have a line width of at least 0.05 mm and at most 0.2 mm and a line width equal to or smaller than that of each of the finger electrodes 3. Consequently, a possible increase in the usage of the electrode material can be suppressed. Since the light receiving surface alignment marks 6B can be easily formed with a possible increase in the usage of the electrode material suppressed as described above, a possible increase in manufacturing costs can be restrained.

Additionally, in the solar battery cell 200, the light receiving surface alignment mark 6B extends to the outside of the finger electrodes 3, 3 positioned at the opposite ends of the light receiving surface. Thus, the opposite ends of the light receiving surface alignment mark 6B stick out from the corresponding adhesion area SF. When each conductive adhesion film 5 is applied to the solar battery cell 200, the opposite ends of the light receiving surface alignment mark 6B stick out from the conductive adhesion film 5. This enables visual determination whether or not the conductive adhesion films 5 have been applied to the intended positions. The TAB wires 4 can be more accurately connected to the intended positions.

Furthermore, in the solar battery module formed of the solar battery cells 200, a plurality of the solar battery cells 200 are arranged, and the finger electrodes 3 on one of the adjacent solar battery cells 200 are connected to the back surface electrode 7 formed on the back surface 22 of the other solar battery cell 200 by means of the respective TAB wires 4 arranged along the corresponding light receiving surface alignment marks 6B via the corresponding conductive adhesion films 5. In such a solar battery module, the TAB wires 4 are accurately connected to the intended positions, allowing the array of the solar battery cells 200 to be restrained from meandering. Thus, when a solar battery module is manufactured, a possible residual stress in the solar battery cells 200 can be suppressed, allowing manufacturing yield to be improved.

Furthermore, as will be appreciated from the foregoing description, a solar battery cell according to the invention can be made by a method including: providing a photovoltaic substrate having a plurality of finger electrodes arranged on a light receiving surface thereof, the light receiving surface having a region of predetermined width to receive a conductive adhesive of a same width as the region; and providing the region with an alignment marking indicating a position where the adhesive is to be applied over the surface, the alignment marking having a cross-dimension in a widthwise direction of the region that is less than the predetermined width, the alignment marking being provided either before or after the plurality of finger electrodes are formed on the light receiving surface.

Additionally, a solar battery module of the invention can be made by a method that includes: 1) providing a plurality of the solar battery cells according to the invention; 2) positioning the TAB wire along the alignment marking on one of the plurality of solar battery cells and connecting the TAB wire to the finger electrodes of the one solar battery cell via a conductive adhesive; and 3) connecting the TAB wire to a back surface electrode formed on a back surface of another of the plurality of solar battery cells; wherein steps 2) and 3) may be performed in either order.

The preferred embodiments of the present invention have been described above in detail. However, the present invention is not limited to the above-described embodiments. For example, in the above-described embodiments, the light receiving surface alignment marks 6A and 6B are each arranged in the center of the corresponding adhesion area SF. However, each of the light receiving surface alignment marks 6A and 6B may be arranged along the outer periphery of the corresponding adhesion area SF.

Furthermore, in the above-described embodiments, the back surface electrode 7 and the TAB wires 4 are connected together via the respective conductive adhesion films 5. However, the back surface electrode 7 and the TAB wires 4 may be electrically connected together by providing bus bar electrodes formed of Ag or the like at the respective positions on the back surface electrode 7 to which the corresponding TAB wires 4 are connected, and connecting the bus bar electrodes to the respective TAB wires 4 by solder.

Additionally, in the above-described embodiments, the film-like conductive adhesion films 5 are used as conductive adhesives. However, liquid conductive adhesives may be applied.

In the above-described embodiments, the light receiving surface alignment marking can be formed of a different material from that of the finger electrodes. As a material for the light receiving surface alignment marking, for example, manufacturing costs can be suppressed by employing an inexpensive material than the material for the finger electrodes. It should be noted that the different material includes materials comprising different components or the same components in a different content rate.

Figure 6:
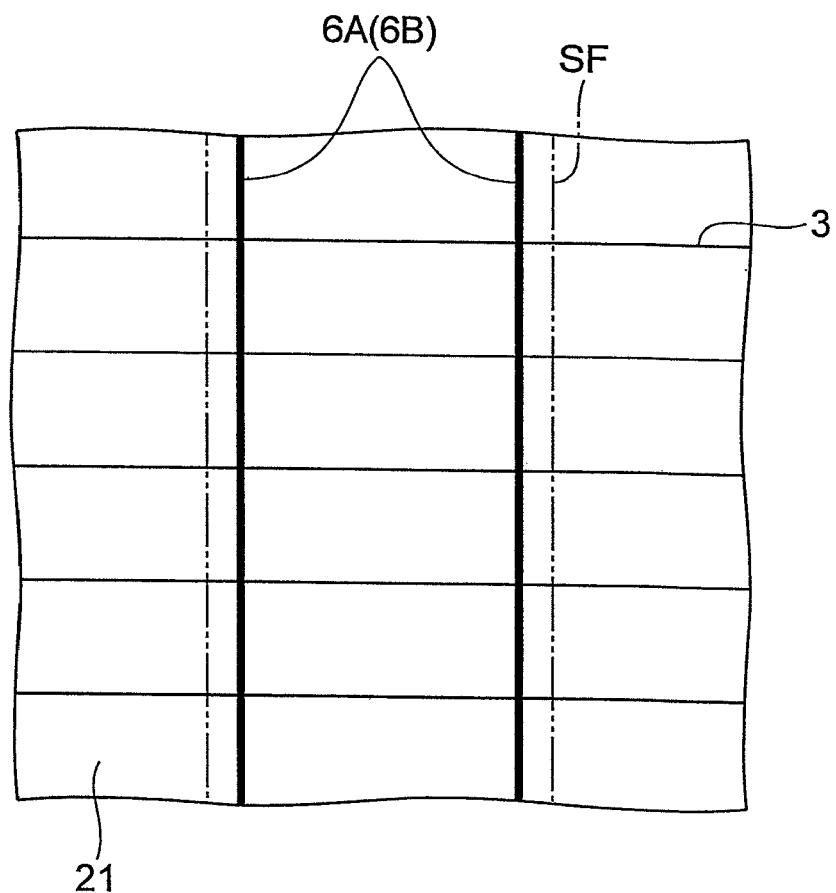
FIG. 6 is a figure showing one example of arrangement of the light receiving surface alignment mark.
Figure 7:
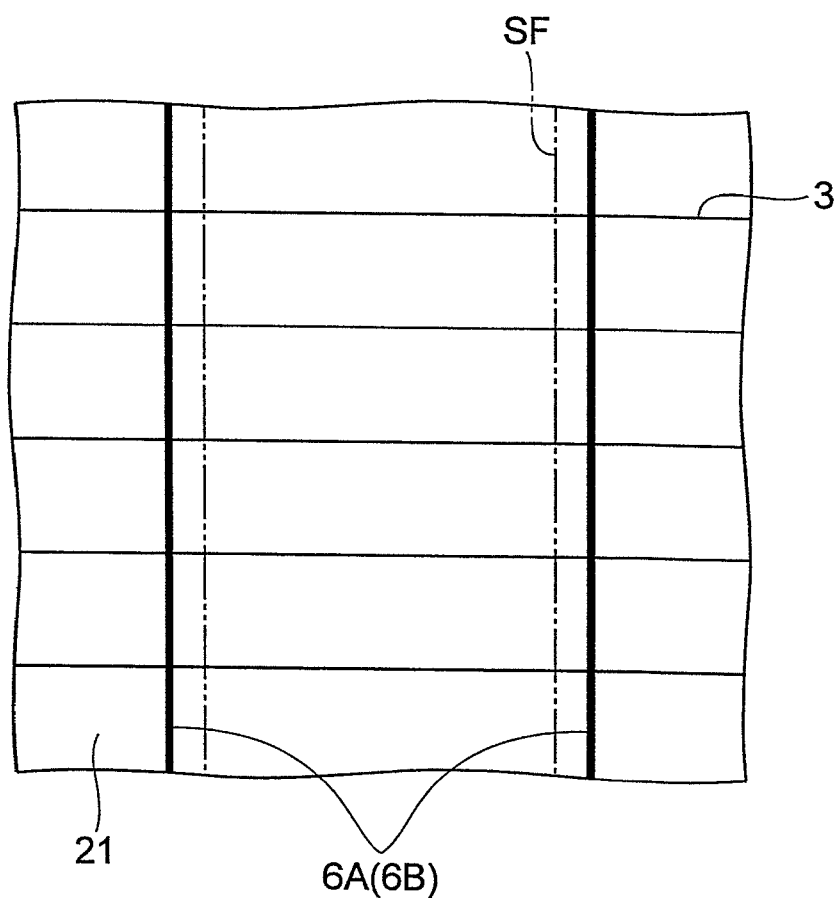
FIG. 7 is a figure showing one example of arrangement of the light receiving surface alignment mark.
Figure 8:
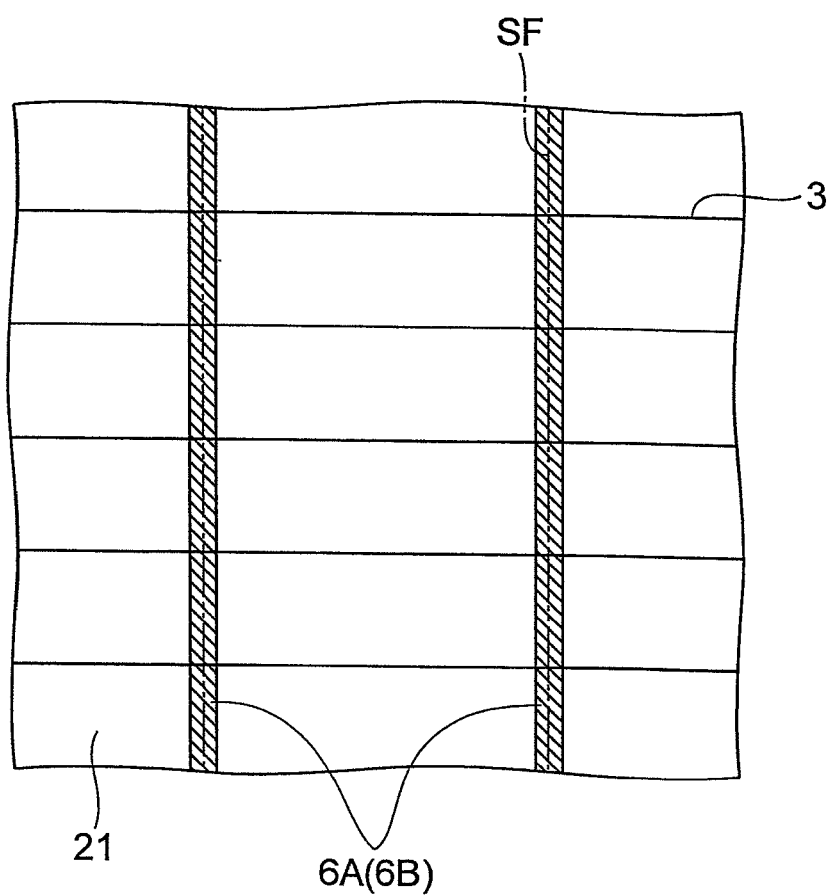
FIG. 8 is a figure showing one example of arrangement of the light receiving surface alignment mark.

Furthermore, in the above-described embodiments, a plurality of the light receiving surface alignment marks 6A and 6B, as shown in FIG. 6, can be arranged in the corresponding adhesion area SF. In this case, the visuality of the light receiving surface alignment marks can be improved. Also, in the above-described embodiments, the light receiving surface alignment marks 6A and 6B, as shown in FIG. 7, may be arranged along the outer periphery of the corresponding adhesion area SF. In this case, the light receiving surface alignment mark can be visually identified after the conductive adhesive is applied, and the TAB wire can be accurately connected to an intended position. Moreover, in the above-described embodiments, the light receiving surface alignment marks 6A and 6B, as shown in FIG. 8, can be arranged in a position which lies in both inside and outside of the adhesion area. In this case also, the light receiving surface alignment mark can be visually identified after the conductive adhesive is applied, and the TAB wire can be accurately connected to an intended position.

Figure 9:
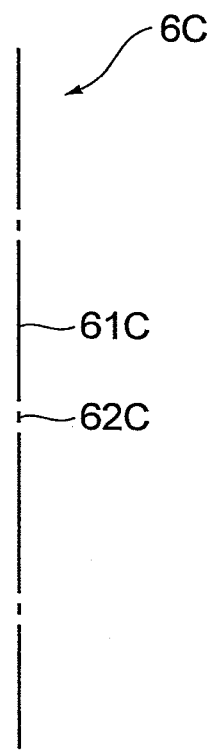
FIG. 9 is a figure showing one example of the light receiving surface alignment mark in the form of dashed line.

Also, in FIG. 6, FIG. 7, and FIG. 8, among the plurality of the light receiving surface alignment marks arranged with respect to the adhesion area SF, a part of the alignment marks is linear as shown in FIG. 6, FIG. 7 and FIG. 8 and the rest of the alignment marks can be dashed lines as shown in FIG. 9.

Furthermore, in the above-described embodiments, as the solar battery cell, especially, those with a single crystalline silicon substrate, those with a polycrystalline silicon substrate, or those with a substrate in which a single crystalline silicon is laminated with an amorphous silicon (for example, HIT series manufactured by Panasonic Corporation) are preferable.

Also, in the above-described embodiments, materials for the finger electrodes, other than the above-described materials, include materials such as glass paste containing aluminum, glass paste containing copper, and glass paste containing an alloy comprising at least one of silver, aluminum, and copper. The same applies to the materials for the light receiving surface alignment markings in the above-described embodiments.

Moreover, in the above-described embodiments, the line width of the light receiving surface alignment marking, even more preferably, is at least 0.10 mm and at most 0.18 mm.

Also, in the above-described embodiments, even though the number of the adhesion areas SF (the number of TAB wires) is described as 2, it may be other numbers (for example, 3 to 5).

Also, the finger electrodes need not be linear.

What is claimed is:

1. A solar battery module, comprising:
 a plurality of solar battery cells, each of the plurality of solar battery cells comprising:
   a plurality of finger electrodes arranged on a light receiving surface of a photovoltaic substrate, said light receiving surface having a region of predetermined width on which a conductive adhesive is applied;
   said region being provided with an alignment marking indicating a position where the adhesive is to be applied over the surface, said alignment marking being disposed in portions of both the inside and the outside of said region in a widthwise direction of said region;
   said alignment marking being a straight line orthogonal to a direction in which said finger electrodes extend and having a cross-dimension in a widthwise direction of said region that is less than said predetermined width, and said alignment marking having a line width smaller than a line width of each of the finger electrodes; and
 a TAB wire positioned along the alignment marking on one of the plurality of solar battery cells and connected to the finger electrodes of said one of the plurality of solar battery cells via said conductive adhesive, and further connected to a back surface electrode formed on a back surface of another of the plurality of solar battery cells.

2. The solar battery module of claim 1, wherein:
 the alignment marking is formed of a material identical to that of the finger electrodes.

3. The solar battery module of claim 2, wherein:
 the alignment marking crosses all the finger electrodes so as to connect together two of the finger electrodes positioned nearest opposite ends of the light receiving surface, and
 the alignment marking is integral with the finger electrodes.

4. The solar battery module according to claim 3, wherein the alignment marking extends beyond said two of the finger electrodes positioned nearest opposite ends of the light receiving surface.

5. The solar battery module of claim 1, wherein:
the alignment marking is formed of a different material from that of the finger electrodes.

6. The solar battery module of claim 5, wherein:
the alignment marking crosses all the finger electrodes so as to connect together two of the finger electrodes positioned nearest opposite ends of the light receiving surface.

7. The solar battery module according to claim 6, wherein the alignment marking extends beyond said two of the finger electrodes positioned nearest opposite ends of the light receiving surface.

8. The solar battery module of claim 1, wherein:
a plurality of alignment markings is provided along the direction the finger electrodes extend, with respect to said region.

9. The solar battery module of claim 1, wherein:
said conductive adhesive has a same width as said region of predetermined width.

10. The solar battery module of claim 1, wherein:
the alignment marking has a line width of at least 0.05 mm and at most 0.2 mm.

11. The solar battery module of claim 1, wherein:
said conductive adhesive is a resin in which metal particles are dispersed.

12. The solar battery module of claim 1, wherein:
said alignment marking has a continuous linear configuration.

13. The solar battery module of claim 1, wherein:
said alignment marking has a discontinuous linear configuration including portions as dashed lines.

14. The solar battery module of claim 1, wherein:
said alignment marking extends in a direction parallel to the direction in which said region extends.

15. A solar battery module, comprising:
a plurality of solar battery cells, each of the plurality of solar battery cells comprising:
    a plurality of finger electrodes arranged on a light receiving surface of a photovoltaic substrate, said light receiving surface having a region of predetermined width on which a conductive adhesive is applied;
    said region being provided with an associated line disposed in portions of both the inside and the outside of said region in a widthwise direction of said region, said associated line being a straight line orthogonal to a direction in which said finger electrodes extend and having a line width of at least 0.05 mm and at most 0.2 mm and smaller than a line width of each of the finger electrodes; and
a TAB wire positioned along the associated line on one of the plurality of solar battery cells and connected to the finger electrodes of said one of the plurality of solar battery cells via said conductive adhesive, and further connected to a back surface electrode formed on a back surface of another of the plurality of solar battery cells.

16. The solar battery module of claim 15, wherein:
the line is formed of a material identical to that of the finger electrodes.

17. The solar battery module of claim 16, wherein:
the line crosses all the finger electrodes so as to connect together two of the finger electrodes positioned nearest opposite ends of the light receiving surface, and the line is integral with the finger electrodes.

18. The solar battery module of claim 17, wherein:
the line extends beyond said two of the finger electrodes positioned nearest opposite ends of the light receiving surface.

19. The solar battery module of claim 15, wherein:
the line is formed of a different material from that of the finger electrodes.

20. The solar battery module of claim 19, wherein:
the line crosses all the finger electrodes so as to connect together two of the finger electrodes positioned nearest opposite ends of the light receiving surface.

21. The solar battery module of claim 20, wherein:
the line extends beyond said two of the finger electrodes positioned nearest opposite ends of the light receiving surface.

22. The solar battery module of claim 15, wherein:
a plurality of lines is provided along a direction in which the finger electrodes extend, with respect to said region.

23. The solar battery module of claim 15, wherein:
said conductive adhesive has a same width as said region of predetermined width.

24. The solar battery module of claim 15, wherein:
said conductive adhesive is a resin in which metal particles are dispersed.

25. The solar battery module of claim 15, wherein:
said associated line has a continuous linear configuration.

26. The solar battery module of claim 15, wherein:
said associated line has a discontinuous linear configuration including portions as dashed lines.

27. The solar battery module of claim 15, wherein:
said associated line extends in a direction parallel to the direction in which said region extends.

28. A solar battery module, comprising:
a plurality of solar battery cells, each of the plurality of solar battery cells comprising:
    a plurality of finger electrodes arranged on a light receiving surface of a photovoltaic substrate, said light receiving surface having a region of predetermined width on which a conductive adhesive is applied;
    said region being provided with a line disposed in portions of both the inside and the outside of said region in a widthwise direction of said region, said line being a straight line orthogonal to direction in which said finger electrodes extend and having a line width equal to or smaller than a line width of each of the finger electrodes; and
a TAB wire positioned along the line on one of the plurality of solar battery cells and connected to the finger electrodes of said one of the plurality of solar battery cells via said conductive adhesive, and further connected to a back surface electrode formed on a back surface of another of the plurality of solar battery cells.

29. The solar battery module of claim 28, wherein:
the line is formed of a material identical to that of the finger electrodes.

30. The solar battery module of claim 29, wherein:
the line crosses all the finger electrodes so as to connect together two of the finger electrodes positioned nearest opposite ends of the light receiving surface, and the line is integral with the finger electrodes.

31. The solar battery module of claim 30, wherein:
the line extends beyond said two of the finger electrodes positioned nearest opposite ends of the light receiving surface.

32. The solar battery module of claim 28, wherein:
the line is formed of a different material from that of the finger electrodes.

33. The solar battery module of claim 32, wherein:
the line crosses all the finger electrodes so as to connect together two of the finger electrodes positioned nearest opposite ends of the light receiving surface.

34. The solar battery module of claim 33, wherein:
the line extends beyond said two of the finger electrodes positioned nearest opposite ends of the light receiving surface.

35. The solar battery module of claim 28, wherein:
a plurality of lines is provided along the direction the finger electrodes extend, with respect said region.

36. The solar battery module of claim 28, wherein:
said conductive adhesive has a same width as said region of predetermined width.

37. The solar battery module of claim 28, wherein:
said conductive adhesive is a resin in which metal particles are dispersed.

38. The solar battery module of claim 28, wherein:
said line has a continuous linear configuration.

39. The solar battery module of claim 28, wherein:
said line has a discontinuous linear configuration including portions as dashed lines.

40. The solar battery module of claim 28, wherein:
said line extends in a direction parallel to the direction in which said region extends.

41. A solar battery module, comprising:
a plurality of solar battery cells, each of the plurality of solar battery cells comprising:
a plurality of finger electrodes arranged on a light receiving surface of a photovoltaic substrate, said light receiving surface having a region of predetermined width on which a conductive adhesive of a same width as said region is applied;
said region being provided with an associated line indicating a position where the adhesive is to be applied over the surface, said associated line being disposed in portions of both the inside and the outside of said region in a widthwise direction of said region;
said associated line being a straight line orthogonal to a direction in which said finger electrodes extend and having a cross-dimension in a widthwise direction of said region that is less than said predetermined width; and
a TAB wire positioned along the associated line on one of the plurality of solar battery cells and connected to the finger electrodes of said one of the plurality of solar battery cells via said conductive adhesive, and further connected to a back surface electrode formed on a back surface of another of the plurality of solar battery cells.

42. The solar battery module of claim 41, wherein:
said conductive adhesive is a resin in which metal particles are dispersed.

43. The solar battery module of claim 41, wherein:
said associated line has a continuous linear configuration.

44. The solar battery module of claim 41, wherein:
said associated line has a discontinuous linear configuration including portions as dashed lines.

45. The solar battery module of claim 41, wherein:
said associated line extends in a direction parallel to the direction in which said region extends.

* * * * *